United States Patent [19]

Nishizawa

[11] Patent Number: 4,685,979
[45] Date of Patent: Aug. 11, 1987

[54] METHOD OF MANUFACTURING A GROUP II-VI COMPOUND SEMICONDUCTOR DEVICE HAVING A PN JUNCTION

[76] Inventor: Jun-ichi Nishizawa, 6-16, Komegafukuro 1-chome, Sendai-shi, Miyagi-ken, Japan

[21] Appl. No.: 636,408

[22] Filed: Jul. 31, 1984

Related U.S. Application Data

[63] Continuation-in-part of Ser. No. 628,974, Jul. 10, 1984, which is a continuation of Ser. No. 266,042, May 21, 1981, abandoned.

[30] Foreign Application Priority Data

May 29, 1980 [JP] Japan .................................. 55-79805

[51] Int. Cl.⁴ ............................................. H01L 21/388
[52] U.S. Cl. ........................................ 437/81; 437/905
[58] Field of Search ............... 148/171, 172, 186, 187, 148/188, 189; 29/569 L; 156/DIG. 77, 616 R

[56] References Cited

U.S. PATENT DOCUMENTS

| | | | |
|---|---|---|---|
| 3,549,434 | 12/1970 | Aven | 148/DIG. 41 |
| 3,578,507 | 5/1971 | Chiang et al. | 357/61 X |
| 3,615,877 | 10/1971 | Yamashita | 148/189 X |
| 3,670,220 | 6/1972 | Kun et al. | 148/1.5 X |
| 3,745,073 | 7/1973 | Kun et al. | 148/189 |
| 3,870,473 | 3/1975 | Kyle | 148/171 X |
| 4,190,486 | 2/1980 | Kyle | 148/171 X |
| 4,389,256 | 6/1983 | Nishizawa et al. | 148/1.5 X |
| 4,465,527 | 8/1984 | Nishizawa | 148/172 X |
| 4,526,632 | 7/1985 | Nishizawa et al. | 148/172 X |

FOREIGN PATENT DOCUMENTS 2107518 4/1983 United Kingdom ............. 29/569 L

OTHER PUBLICATIONS

Washiyama et al, *Electronic Materials EFM-78-12*, The Institute of Electrical Engineers of Japan, Tokyo, Japan, Nov. 29, 1978, pp. 1-9, (translated).
Hamilton, P. M., *SCP and Solid State Technology*, "Advances in III-V and III-VI Semiconductor Compounds", Jun. 1964, pp. 15-19.

*Primary Examiner*—George T. Ozaki
*Attorney, Agent, or Firm*—Cushman, Darby & Cushman

[57] ABSTRACT

A method of manufacturing a semiconductor device having a single crystal pn junction formed in a Group II-VI compound semiconductor crystal, by: growing a Group II-VI compound semiconductor crystal substrate of n type from a melt of a crystal-constituting Group VI element other than Te; forming a crystal temperature difference in the melt which applying a vapor pressure of the Group VI element onto the melt; forming, on the substrate, a semiconductor region of p type by diffusing an acceptor impurity into the n type crystal under a predetermined vapor pressure of the constituent Group VI element. Thus, it becomes possible to provide light-emitting diodes emitting green, blue-green or violet color region if ZnSe crystals are used.

10 Claims, 4 Drawing Figures

METHOD OF MANUFACTURING A GROUP II-VI COMPOUND SEMICONDUCTOR DEVICE HAVING A PN JUNCTION

CROSS REFERENCE TO RELATED APPLICATION

This is a continuation-in-part of my copending application Ser. No. 628,974 filed July 10, 1984, which in turn is a continuation of my co-pending application Ser. No. 266,042 filed May 21, 1981 and now abandoned.

BACKGROUND OF THE INVENTION (a) Field of the invention:

The present invention concerns pn junction semiconductor devices using Group II-VI compound semiconductors and their manufacturing method, and more particularly it pertains to ZnSe pn junction devices and their manufacturing method.

(b) Description of the prior art:

Research and development of pn-junction light-emitting diodes which are so-called LEDs using various kinds of semiconductor materials are under way at present.

There have been and are being manufactured various different kinds of light-emitting devices having different light emission wavelengths to comply with various different purposes. The wavelengths of the light range roughly from the infrared region to the color green in the visible region. Some examples are as follows.

LEDs made of GaAs having an energy band gap of about 1.43 eV emit light in the infrared region at a peak intensity of about 9100 Å. GaP LEDs which are not doped and which have an energy band gap of 2.26 eV emit light of green color having its peak intensity at 5550 Å, while GaP LEDs which are doped with nitrogen as an impurity emit a yellow-color light having its peak intensity at about 5800 Å. Also, in mixed crystals $Ga_{1-x}Al_xAs$, it is known that, by varying the component ratio x, LEDs emitting a red color light having a peak intensity at about 6500 Å or a yellow color light having a peak intensity of about 5900 Å are obtained.

The wavelength for the peak intensity of light which is emitted from an LED depends strongly on the energy band gap of the semiconductor material with which the LED is made.

The wavelength for light emission at peak intensity appears in a wavelength region longer than the absorption edge of the semiconductor. The wavelength λ of the absorption edge, which is the shortest wavelength possible for emission, is expressed by:

$$\lambda_m = \frac{hc}{E_g} \approx \frac{1.24}{E_g(eV)} \ (\mu m)$$

wherein:
 h represents Planck's constant;
 c represents the velocity of light; and
 $E_g$ represents the energy band gap of the semiconductor material, expressed by eV.

The wavelengths of emitting light of known LEDs extend up to about 5550 Å which is green color. And, there have been provided no LEDs whose emitting light has a higher energy than that mentioned above, i.e. a light of a shorter wavelength which, in terms of color, is in the region of blue-green, blue and violet, although there are strong demands for such LEDs. Until now, however, no such LEDs have been obtained because of the reasons described below.

In order to obtain an LED having such a region of wavelength of emitting light as mentioned above, it is necessary to use semiconductor materials having an energy band gap wider than that of Group III-V compound semiconductors such as GaAs, GaP or $Ga_{1-x}Al_xAs$. As such semiconductors, there are Group II-VI compound semiconductors such as ZnSe ($E_g \approx 2.8$ eV) and ZnS ($E_g \approx 3.6$ eV). These semiconductors have wide energy band gaps, so that they have attracted the interest of researchers and have been studied. Nevertheless, owing to various technical problems, they have not been put to practice yet. The Group II-VI compound semiconductors such as ZnSe stated above have a wide energy band gap, and for a long time crystals have been produced either as a photoconductive semiconductor or as an electroluminescent semiconductor. There have been practiced various kinds of methods of producing these semiconductor crystals. In order to obtain a single crystal, however, which is large enough to permit the fabrication of a semiconductor device, there has been adopted a melt growth method as represented by the Bridgman method. As is well known, however, there has been technical difficulties in achieving free control of the conductivity types of Group II-VI compound semiconductors. In Table 1 are shown the conductivity types and energy band gaps of Group II-VI compound semiconductors which have been obtained in the past.

TABLE 1

|  | ZnS | ZnSe | ZnTe | CdS | CdSe | CdTe |
|---|---|---|---|---|---|---|
| Conductivity type | n | n | p | n | n | n<br>p |
| Energy band gap | 3.6 eV | 2.8 eV | 2.2 eV | 2.5 eV | 1.74 eV | 1.5 eV |

The semiconductor materials listed in Table 1 invariably have a wide energy band gap, and will bring about a very effective result if LEDs are manufactured with them. However, they have not permitted free control of their conductivity type until now. With ZnS, CdS or ZnSe, n-type conductivity is easily obtained. However, even by doping an acceptor impurity in order to obtain the p type, the result would be that the doped crystal still remains an n-type or p-type having a very high resistivity. Even when the crystal happens to the p-type, its control is so difficult that the formation of a pn junction necessary for an LED has not been possible.

SUMMARY OF THE INVENTION

It is an object of the present invention to provide a method of manufacturing a semiconductor device having a desirable single crystal pn junction using Group II-VI compound semiconductors, by improving the physical manufacturing conditions which would bring about the above-stated desirable result.

Another object of the present invention is to provide a method of manufacturing a pn junction semiconductor device which is capable in the emitting light of green, blue-green, blue or violet color region by the use of a ZnSe crystal.

DETAILED DESCRIPTION OF THE PREFERRED EMBODIMENTS

Hereunder will be stated the reason why, in Group II-VI compound semiconductors such as, ZnSe, ZnS and CdS, one of the conductivity types can be easily formed, whereas the other conductivity type opposite thereto cannot be formed, or even when it is formed, the crystal produced could be one having such a high resistivity as to be close to an insulator, and the reason why in practice a pn junction has not been obtained.

Because Group III-V compound semiconductors and Group II-VI compound semiconductors are comprised of two elements, these compound semiconductors have physical problems which are not encountered in elemental semiconductors such as silicon.

Among the problems, the most important is the deviation from stoichiometry of the crystals. That is, in compound semiconductors which are comprised of two elements, the desirable composition ratio of the two constituent elements is perfectly 1 : 1. In an actual crystal, however, a large number of vacancies or interstitial atoms are produced during the growth of the crystal, resulting in a deviation from the proportion of 1 : 1. As a semiconductor crystal and a device using the crystal are obtained invariably after going through a heating step as in, for example, the crystal growth, it should be noted that, in semiconductors such as Group II-VI or Group III-V compound semiconductors which are comprised of two elements, the presence of a difference in vapor pressure between the two elements greatly affects the crystal characteristics.

Figure 1:
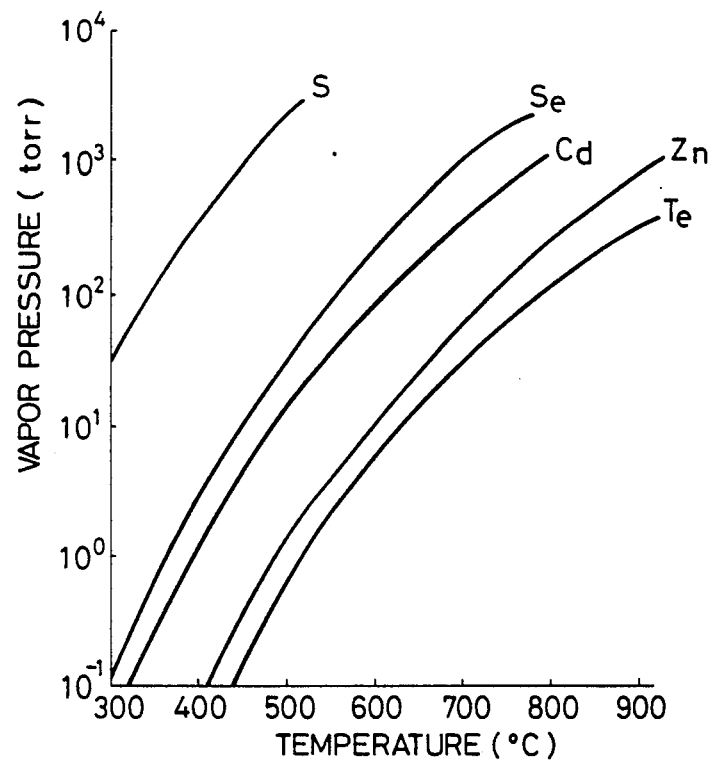
FIG. 1 is a chart showing the relation between vapor pressure and temperature for Zn, Cd, S, Se and Te elements.

The relationship between the vapor pressure and the temperature of major elements among those elements constituting Group II-VI compound semiconductor crystals are shown in FIG. 1. It will be noted from this chart that, in ZnS, ZnSe, CdS and CdSe crystals, the Group VI elements have vapor pressures much higher than those of the Group II elements. In a ZnSe crystal which is considered to be most suitable for the materialization of a blue-color LED, Se exhibits a value of vapor pressure which is at least one order higher than that of Zn at a same temperature. Therefore, when a crystal is produced, there will develop a considerably large deviation from stoichiometry. This deviation from stoichiometry occurs similarly in Group II-VI compound semiconductors. However, in Group II-VI compound semiconductors, the deviation from stoichiometry will more intensively and more complicately influence the conductivity type or the impurity concentration. As stated above, in such semiconductors as ZnSe and CdS, it should be noted that Se and S have higher vapor pressure as compared with Zn and Cd as shown in FIG. 1. Therefore, in these crystals, there exist a number of vacancies of S sites and Se sites which serve as donors. It is difficult to make a p-type region from these crystals by doping an impurity serving as an acceptor, because vacancies of S or Se acting as a donor are produced much more during the crystal fabrication process than in the original bulk, compensating for the acceptor. Accordingly, the resulting crystal easily tends to become a high-resistivity crystal. Such a phenomenon is known as the self-compensation effect.

The "temperature difference method under controlled vapor pressure" for the growth of a single crystal was disclosed in, for example, Japanese Patent No. 1,038,328. This method was applied first to Group III-V compound semiconductors, and was found to be very effective in controlling the deviation from stoichiometry to a minimum.

Until such time as mentioned above, there had been achieved a pretty good advancement in the study of the growth of such a Group III-V compound semiconductor crystal as GaAs, and also the technology of the formation of a pn junction device had seen development to a considerably high level. In contrast thereto, however, such Group II-VI compound semiconductor crystals as ZnSe and CdS, owing to reasons such that they have physical characteristics considerably different from those of Group III-V compound semiconductor crystals and that their crystal growth is quite difficult technically, they have not been used for any other purposes than merely the production of photoconductors which are devices obtained simply by forming an ohmic contact on a bulk crystal. Furthermore, due to the fact that it has not been found until recently that the reason why the crystal which is grown is only an n type is due to the deviation from stoichiometry, the possibility of producing a pn junction device with ZnSe or CdS has hardly become the subject for study. That is, merely by doping a p type impurity, a p type crystal could not have been obtained.

Very recently, however, it has been found that a crystal growth method which is called "a temperature difference method under controlled vapor pressure" works very effectively also for the single crystal growth method using Group II-VI compound semiconductors which is intended to obtain a crystal of good crystal perfection and which permits one to control the conductivity type as well as the impurity concentration of the crystal.

As such, the inventor of the present invention has previously proposed a method of growing Group II-VI compound semiconductor crystals centering around ZnSe crystals as seen in copending U.S. patent application Nos. 424,301 and 266,042. In this method, a single crystal of a compound semiconductor is grown from the melt which is constituted of the component elements. The melt composition is usually nonstoichiometric so that growth temperature is much lower than the melting temperature of the crystal. A temperature difference is formed in the melt to cause the diffusion of source materials to the seed or substrate single crystal, while the temperature of each different temperature region of the melt is held constant during the growth. A constant vapor pressure of the volatile component element is applied onto the melt during the growth, as is clear from the above-mentioned references. In the references, there is mentioned that the growth is due to the constant flow of the solute materials from the high-temperature region of the melt where the source materials are placed onto the substrate held at the lowtemperature region of the melt, so that the thickness of the grown layer proportionally increases with an increase in the growth time despite the fact that the temperatures of these regions of the melt are held constant. This is different from the conventional slow-cooling liquid-phase growth where a growth occurs due to the supersaturation of the melt as a result of temperature-lowering so that the amount of deposition is limited by the solubility at the starting temperature. It is also mentioned in the references that the vapor pressure is applied upon the melt, not directly on the substrate or the seed. This is very different from the usual heattreatment under the vapor pressure where the vapor is applied directly onto the solid phase. In the usual crystal growth method of ZnSe, a considerably high growth temperature is required. In case of a growth conducted at a temperature near the melting point such as in the Bridgman method, such temperature has usually been about 1520° C., and in case of the vapor transport growth, the temperature has been usually 1000° C. or higher. By relying on the solution growth technique utilizing the temperature difference method under controlled vapor pressure, however, crystals having a sufficiently high quality can be grown at a temperature ranging from 900° to 950° C. or even lower. Thus, only from the viewpoint of growth temperature, deviation from stoichiometry due to vaporization of such a Group VI element as Se or S can be remarkably suppressed.

Figure 2:
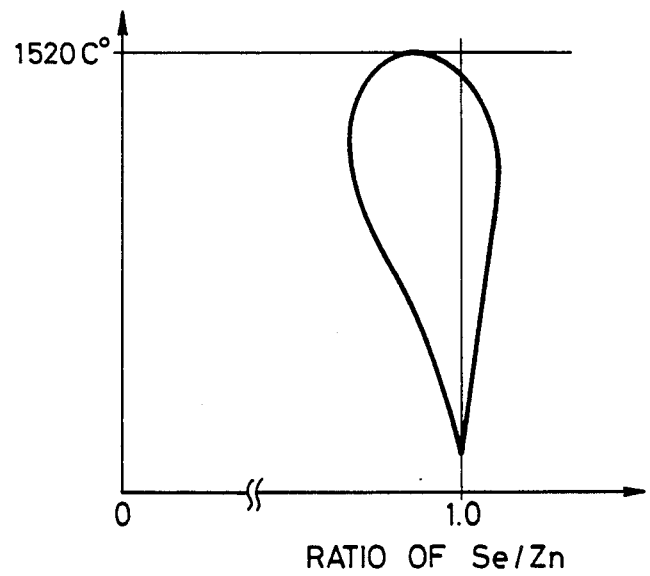
FIG. 2 is a schematic diagram showing the relationship between the range of deviation from stoichiometry of a ZnSe crystal and the growth temperature.

That is, as shown in FIG. 2, the amount of the crystal's deviation from stoichiometry, $\delta$, is markedly reduced as the growth temperature becomes lower, as expressed by:

$$\delta = A \exp\left(-\frac{E}{kT}\right)$$

wherein:
A represents a constant;
k represents a Boltzmann constant;
T represents an absolute temperature °K.; and
E represents the energy for forming a vacancy.

The reduction of $\delta$ means a reduction of the density of vacancies of Se or S. Moreover, according to the temperature difference method under controlled vapor pressure, it is possible to arbitrarily control the vapor pressure applied onto the melt. Accordingly, by the application of said temperature difference method under controlled vapor pressure, it becomes possible to suppress the self-compensation effect due to the generation of vacancies of Se or S, and to thereby form a desirable pn junction with Group II-VI compound semiconductors.

Now description will hereunder be made of the present invention with respect to a ZnSe crystal which has such an energy band gap as is most suitable for the materialization of a blue-color emitting LED.

As the melt metal which serves as the solvent for use in the solution growth of a ZnSe crystal, there have been the reports that Ga, In and Sn have been used. In order to obtain, however, such a crystal as does not deviate from the physical characteristics of the pure crystal or of ZnSe without going so far as to giving attention to such a concept as stoichiometry, it will be clear that it is desirable to select the melt metal from among Group II or Group VI elements which constitute the crystal. In case, for example, a ZnSe crystal is grown by relying on the solution growth technique, Zn or Se atoms ought to be selected as the melt, if other factors which influence the growth are not taken into account. And, if they are absolutely not proper as the melt for the solution growth, there may be enumerated Cd which is a Group II element, and S or Te which belongs to Group VI, as a melt for constituting a ZnSe crystal.

In a ZnSe crystal, as will be understood from FIG. 1, Zn atoms have a vapor pressure having a value lower than that of Se atoms. Accordingly, in order to avoid a deviation of the crystal from stoichiometry due to vaporization, it has been considered convenient to use Se as the melt since this permits continuous supply of atoms rather than using Zn atoms. Conventionally, however, there has not been used Se as the melt for the following reasons.

Firstly, no sufficient study has been made with respect to the solubility of a ZnSe crystal to the Se melt. To the extent of the conventional study, it has been considered that the solubility thereof is very small. Accordingly, it has been considered difficult in the past to rely on the technique of dissolving a ZnSe source crystal in an Se melt to thereby cause recrystallization at a specific site which may be for example the surface of a ZnSe substrate by epitaxial growth.

Secondly, there is the problem of the value of vapor pressure of Se. As will be noted also from FIG. 1, Se has a vapor pressure which is about one order higher than that of Zn element at a same given temperature, and also, at the ZnSe crystal growth temperature which is close to the melting temperature of about 1520° C. in case of, for example, the Bridgman method, the vapor pressure of Se will become about $10^4$ Torr or higher, which is considerably higher than the atmospheric pressure. Therefore, a quartz tube which is frequently employed in ordinary growth is to the danger of being destroyed due to the high temperature. It is for this reason that the employment of Se has not been considered in the past.

As a result, in the solution growth method relying on the temperature difference technique which can be conducted at a temperature much lower than the melting point of ZnSe, there have been proposed a method by Washiyama or Nishizawa Ser. No. 266,042 to use Te as the melt, and a method proposed by Nishizawa (U.S. patent application No. 272,763) to use a melt which is comprised of the element Te partly containing the element Se. The reason why the element Te is used as a melt is that, for one thing, although no detailed comparative data have been reported yet, it has been known that the solubility of the ZnSe crystal is greater than Se, and that the vapor pressure of the element Te is much lower than Se, and also that it is lower than that of the element Zn which is the other constituting element.

Furthermore, when a growth is conducted according to the conventional method, that is, by the use of a Te melt, and at a temperature which is in the vicinity of the melting point of the ZnSe crystal, the solubility of the crystal will increase as the temperature increases. Accordingly, the solid solubility of Te into ZnSe will become greater, so that, as a result, there is obtained anything else but only a mixed crystal of ZnSe and ZnTe, which crystal being such that it cannot be regarded as a ZnSe crystal. In contrast thereto, by relying on the solution growth method incorporating the temperature difference technique, the growth temperature can be lower than about 1000° C., and thus a low growth temperature can be utilized. Thus, the amount of Te atoms migrating into the ZnSe crystal will be 1% or less, and accordingly it has been considered possible to regard the resulting crystal as substantially a perfect ZnSe crystal. In fact, such a crystal has been considered to be one having a good crystal perfection which permits one to control both the conductivity type and the impurity concentration, as compared with those crystal previously obtained.

As will be understood from the above discussion, Group II-VI compound semiconductor materials are difficult to manufacture crystals, and will easily give rise to a deviation from stoichiometry as compared with Group III-V compound semiconductor materials. Thus, in order to fabricate a semiconductor device having a pn junction in which both the conductivity type and the impurity concentration are controlled, there has to be given consideration to minimize the deviation of the crystal from stoichiometry in all the heating steps including the heating when doping an impurity for determining the conductivity type. Accordingly, the parent application provides for a semiconductor device fabricating method as well as a device obtained by this method which incorporates the abovesaid consideration and using the element Te as the solvent (melt) in conducting the growth of a crystal.

In case a Group II-VI compound semiconductor device having a pn junction, especially a ZnSe LED, is manufactured by paying such attention as well as such a consideration as mentioned above, it has become possible to obtain, with stability, a ZnSe crystal which serves as the p type region, which has never before been possible till then, and it should be noted also that even the pn junction per se has become possible to be formed with stability. That is, it has thus become possible to provide a ZnSe LED which emits a light in the blue color region of the spectra.

In case, however, the light emission characteristics of this ZnSe LED is studied, there has been noted the existence of several problems. And, it has been found that the cause for these problems lies in that the crystal grown by using Te as the solvent is not a pure ZnSe crystal but a mixed crystal $ZnSe_xTe_{1-x}$, and also that, even when the content of Te in the crystal is 1% or less, this Te content gives an important adverse effect upon the light emission characteristics of the produced LED.

If a Te solution is used as a solvent, the difference in atomic radii between Te and Se will develop stresses and imperfections such as dislocations in the crystal grown, and they will serve as the sources of nonradiative point defects like vacancies and interstitial atoms, and will serve as the recombination centers, i.e. as the sources of radiative point defects which contribute to the emission of light having undesirable colors other than the desired green color. It has been found that even a small content of Te of about 1% or less gives a considerable adverse effect upon the crystal grown.

More specifically, in a ZnSe LED aimed to emit a blue color light, it has been found that there cannot be obtained a high emission efficiency of a green color, and also that the LED does not give a purely green color emission but that the emission spectra develops a relatively long range broadening of wavelength.

It has been found that, accordingly, in order to elevate the emission efficiency of the ZnSe LED and to make the emission spectra sharp, it is necessary to avoid the inclusion, into the ZnSe crystal, of Te which causes stresses or imperfection of crystal.

As the result of the subsequent experiments, it has been found, along with the advancement of the technology of conducting experiments, that the solubility of the ZnSe crystal in the Se solution has such a sufficient magnitude as will not hamper the growth of the crystal. Also it has been confirmed that the vapor pressure of Se is higher than that of Te and because, of the development of technology, there can be provided a dual structure growth apparatus, as mentioned in the copending U.S. application No. 489,950, which in case of need, permits the application of a pressure externally to the quartz tube by using another gas where there is the danger that the quartz tube will be broken due to its expansion caused by an elevation of the temperature. It is this sufficiently possible to grow a ZnSe crystal using an Se solution as the melt.

As will be understood from the statements made above, the present invention provides for a method of fabricating Group II-VI compound semiconductor devices having a pn junction, especially ZnSe devices having a pn junction. In order to minimize the deviation of the grown crystal from stoichiometry in any type of process involving a heat treatment in the steps of fabricating semiconductor devices including also the manufacture of crystals, the present invention adopts the method of supplying throughout the heating step, onto the region where the device being fabricated is present, the vapor of one of the constituting elements of Group II-VI compound semiconductor having a higher vapor pressure than the other constituting element, i.e. in the case of a ZnSe crystal, to supply the vapor of Se. Also, the present invention provides for the technique that, in the case of growing a Group II-VI compound semiconductor crystal which will serve as the substrate, or in the case a Group II-VI compound semiconductor crystal is grown on a substrate from liquid phase, the element having a higher vapor pressure among the constituent elements of the Group II-VI compound semiconductor which is to be grown is used as the solvent which is the solution end is used in such a process, and in case of growing a ZnSe crystal, Se is used as the solvent.

The present invention will hereunder be more concretely described with respect to some examples.

EXAMPLE 1

An n-type ZnSe crystal was grown from an Se solution by relying on the temperature difference method in a closed tube, wherein a constant Se vapor pressure was applied, throughout the growth process, onto the crystal being grown. The crystal thus grown had a much lower concentration of defects represented by non-radiative deep levels which, otherwise, served to lower the light-emission efficiency and to degrade the characteristics of emission spectra in actual LEDs, as compared with the crystal grown from a Te solution, which crystal usually containing about 1% of Te in the lattice.

In this example, an Se vapor pressure was constantly applied onto the crystal being grown from its own melt by virtue of conducting the growth in a closed tube to prevent the escaping of the evaporating Se, so that there was no need to externally apply an Se vapor pressure supplied from another temperature zone onto the melt. Thus, this growth method is slightly different from the usual temperature difference method conducted under controlled vapor pressure. In this case, an Se vapor pressure supplied to the melt in a closed tube is controlled to be at the value determined from the growth temperature.

A temperature difference of about 40° C. was established in the Se melt, and the temperatures of the respective high and low temperature regions of the melt was held constant throughout the growth process. The growth temperature of the substrate crystal must be set at 1000° C. or lower, desirably 950° C. or lower, and the vapor pressure also must be set at 1 Torr or higher, desirably $10^2$ Torr or higher. In this example, the temperature of the upper region of the melt was held at a level ranging from about 950° C. to about 990° C. When an acceptor impurity is doped in the subsequent manufacturing of a pn junction, any large generation of vacancies due to self-compensation can be avoided, if such crystals as mentioned above are used as substrates. In the manufacturing process of a pn junction by the diffusion process, it is necessary to perform the diffusion of a p type impurity at as low a temperature as possible in order to suppress the generation of Se vacancies which act as the donors. However, the concentration of the diffused acceptor impurity cannot be made sufficiently large because the diffusion temperature is low. The impurity concentration usually is of the order of $10^{17}$ $cm^{-3}$ or lower. In order that the diffused region can be converted to p-type conductivity, the substrate crystal should be grown at as low a temperature as possible and under a high Se vapor pressure sufficient to reduce the vacancy concentration to less than the abovesaid concentration of the diffused p type impurity. Accordingly, in order to fabricate a pn junction by relying on the diffusion process, the grown substrate crystal is enclosed in a vacuum or an inert gas atmosphere such as argon in a quartz tube, followed by a diffusion of an acceptor impurity during as short a period of time as possible at a temperature within the range of about 300° C. to 600° C. which is relatively low as compared with the ordinary diffusion temperature. In order to form a pn junction by diffusing an impurity at such low temperatures, it is necessary to select the impurity from among those having a large diffusion coefficient. For example, gold as an acceptor diffuses quickly at a low temperature. It takes about 3 minutes to diffuse the impurity atoms of gold to a depth of 1 $\mu$m at 300° C.–400° C. Also, silver diffuses quickly, and it takes only about 1 minute or less to diffuse to a depth of 1 $\mu$m.

As stated above, the diffusion of gold or silver can be performed at a remarkably low temperature and with a large diffusion coefficient. The diffusion of gold or silver can be accomplished during a period of time less than 1 hour at most. Diffusion coefficients of these impurities are larger than that of the Se vacancy which is generated due to vaporization of Se during the diffusing step. Because of the fact that the diffusion is done by the use of such an impurity as mentioned above and at a low temperature and for a short period of time, it becomes possible to obtain a diffused p type region suppressing the generation of vacancies.

Figure 3:
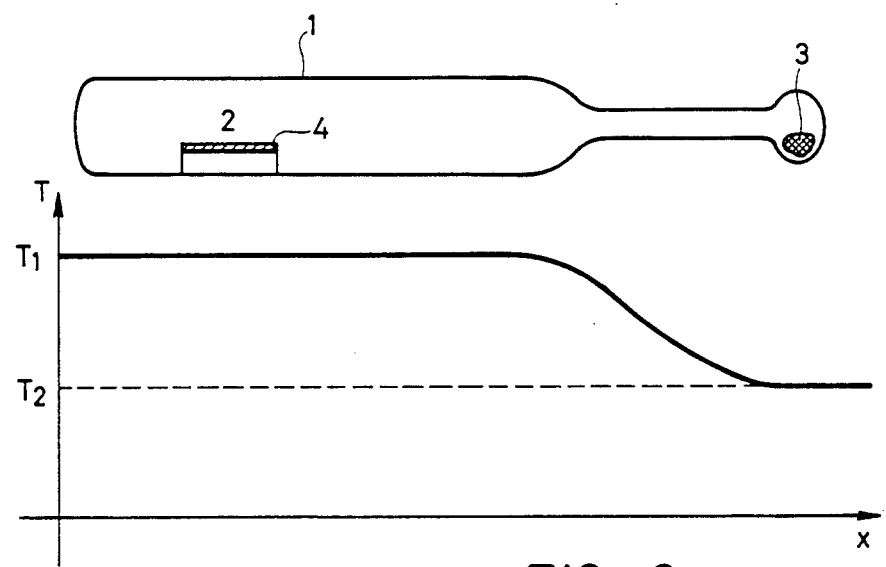
FIG. 3 is a diagram showing the method of diffusing gold as an impurity into a substrate crystal.

However, if an ordinary ZnSe crystal which has not experienced the control of vapor pressure is used as a substrate, a large number of donor vacancies will be present in a substrate from the very beginning of the diffusion, making the formation of a pn junction difficult. In case the diffusion of an impurity is performed in a vacuum in place of an inert gas such as argon, even if the diffusion temperature is set as low as possible, there occurs the escaping of vaporized molecules of Se out of the crystal during the diffusing step. Therefore, the diffusion must be performed in accordance with such a diffusion system as shown in an example in FIG. 3. A crystal substrate 2 deposited with an impurity source 4 such as gold, and a metal Se which is indicated by numeral 3 are enclosed separately from each other in a quartz tube 1 filled with an inert gas such as argon. This quartz tube is placed in two different temperature zones, and diffusion is performed. The temperature $T_1$ in the zone in which the crystal substrate is placed and the temperature $T_2$ in the zone containing the metal Se are independently controlled. Since the vapor pressure of Se is known as a function of temperature, the temperature $T_2$ can be determined so as to provide a required vapor pressure. The Se pressure, and accordingly $T_2$, should be determined as high as possible. If $T_2$ is higher than $T_1$, there would occur an excessive transportation of Se into the first zone. It should be noted, however, that, so long as the diffusion time is short enough to ensure that the amount of transport of Se is not large, the relation $T_2 < T_1$ is not always necessary. In many practices, it is desirable to perform the diffusion of gold or silver at $T_2$ slightly less than $T_1$, as for example $T_1 = 350°$ C. ahd $T_2 = 330°$ C. The Se vapor pressure needs to be at least 0.1 Torr or higher. Ih the abovementioned example, the Se vapor pressure is about 0.5 Torr. During the above-mentioned heat treatment step, the deviation from stoichiometry, i.e. the generation of Se vacancies, is extremely mitigated. Also, selfcompensation hardly occurs.

The self compensation is interpreted as follows. In ordinary cases, when an impurity which serves as an acceptor is doped, the free energy of the crystal as a whole will become high due to the presence of holes which have been captured by the acceptors. Accordingly, under the condition allowing the generation of those vacancies of a Group VI element, namely without Se vapor pressure, the acceptor impurity is compensated for by the generated vacancies, because the generation of vacancies decreases the free energy of the crystal as a whole. Therefore, vacancies are generated in proportion to the amount of the doped acceptor impurity, and thus the crystal will not become a p type or will become highly resistive.

However, if Se vapor is applied constantly onto the crystal during the diffusion step, the vacancy concentration will remain substantially constant, in spite of the incorporation of an acceptor impurity, and moreover this vacancy concentration in the starting substrate is very small. Thus, self-compensation can hardly take place. Unless the growth of the substrate crystal is done under a controlled vapor pressure, the crystal is difficult to be made a p type by the diffusion process.

The impurity diffusion with the application of a vapor pressure of the element constituting the semiconductor crystal is already known. According to this known technique, however, there has not been formed a pn junction in the ZnSe crystal obtained by the conventional growth method for the following reasons. Because the vapor pressure control method is not used during the growth of the substrate crystal and the growth temperature is too high, only such a substrate crystal that contains a remarkably high concentration of vacancies is obtained. Thus, in the subsequent process of diffusing an impurity, the vapor pressure control is not sufficient for reducing vacancies, and in addition, the diffusion time is too short for the reduction of vacancies. It is only in the case wherein this known technique is applied to the substrate obtained under the vapor pressure control method that the formation of a pn junction can be attained.

The range of wavelengths from blue-green to violet color is 5500 Å–4500 Å. This corresponds to the photon energies of 2.25 eV–2.75 eV. On the other hand, the energy band gap $E_g$ of ZnSe at room temperature is about 2.80 eV. Therefore, in order to obtain ZnSe LEDs emitting lights having a wavelength ranging from blue-green to violet color, there must be given a consideration to the value of the impurity level. Therefore, in case the transition between the conduction band and the acceptor level dominates, the appropriate depth of the acceptor level is 0.55 eV–0.05 eV as measured from the valehce band to obtain 5500 Å–4500 Å color, whereas in case the transition between the donor level and the acceptor level dominates, a depth of the acceptor level 0.4–0.02 eV is, appropriate, because the donor level $E_d$ of ZnSe crystal is about 0.03 eV–0.2 eV. Therefore, the acceptor level of an impurity which gives p type conductivity is required to have a value of about 0.5 eV or lower as measured from the valence band. Moreover, it should be noted that, with the acceptor level of 0.5 eV, the ionization of positive holes at room temperature is too little. Thus, in order to give a good electric conduction, in general, the acceptor level should be shallow, and the adoption of such an impurity as having a level of 0.2 eV or lower is more appropriate.

The characteristic of the impurity gold has almost not been known in the past. However, in view of the finding that a pn junction LED having a blue color light emission band has been successfully obtained, gold seems to have an acceptor level of 0.2 eV or lower. Some impurities whose acceptor levels are known for the ZnSe crystal are shown in Table 2. Silver can also be used for the formation of a pn junction. Attention has to be paid, however, to the fact that silver is known to form another deep level of about 0.5 eV.

TABLE 2

| Impurity: | Au | Ag | Cu | P | As | Sb |
|---|---|---|---|---|---|---|
| Acceptor level(eV): | 0.2 | 0.15 0.5 | 0.5 | 0.68 | 0.7 | 0.7 |

Even when an impurity diffusion is performed under a controlled vapor pressure, evaporation of Se will take place to some extent when the vapor pressure is not sufficiently high. Such evaporation of Se can be minimized if the diffusing velocity of the impurity is sufficiently greater than the diffusion velocity of the Se vacancies which have been located near the surface region of the crystal, and if the impurity diffusion is completed during a short period of time. Gold is preferable as such an impurity.

EXAMPLE 2

Figure 4:
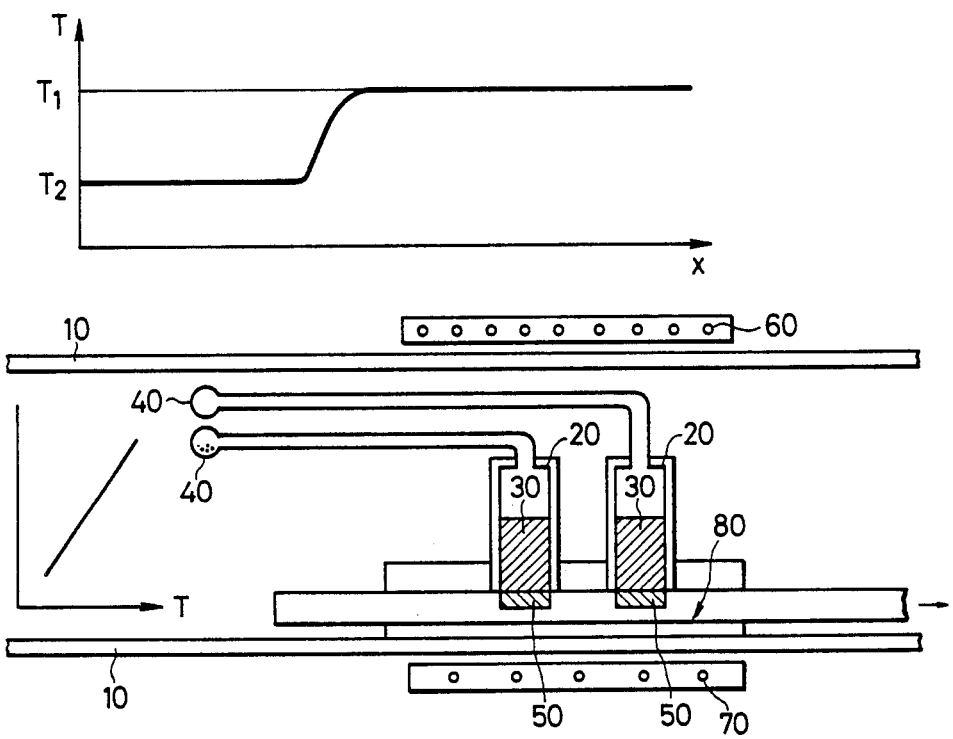
FIG. 4 is a schematic diagram showing the method of manufacturing a pn junction ZnSe by relying on the epitaxial growth technique.

An n-type ZnSe substrate crystal which has been grown by the temperature difference method under controlled Se vapor pressure as described in Example 1 is used. A growth layer of p type ZnSe is formed, by relying on the epitaxial growth technique, on the n-type substrate by relying on the temperature difference method under an Se vapor pressure. This epitaxial growth method adopts the liquid phase growth and employs an apparatus similar to the controlled vapor pressure type epitaxial growth apparatus which is used for Group III-V compound semiconductors. An example thereof is shown in FIG. 4.

On a slider 80 made of carbon and housed within a quartz tube 10 partially shown are placed said substrates 50, 50. In the melt bath vessels 20, 20 are placed batches of a melt metal 30 30 of an Se solution containing Zn element. The top of each melt bath vessel 20 is covered with a lid to provide gas-tightness of the vessel, and the ratio of Zn and Se in the melt metal is set at a desired value. In FIG. 4, the vessels 40, 40 are connected to the melt-containing vessels through the quartz tube to provide a predetermined Se vapor pressure from Se heated at a temperature $T_2$. Instead of providing the vessels 40 and 40, the tops of the melt vessels 20 and 20 may be simply closed by a cover (not shown) made of quartz or carbon to prevent the evaporation and escaping of Se. And also, at the outside of quartz tube 10 and at sites sandwiching therebetween the mixed melt metal bath vessels 20 and 20 and also the substrates 50 and 50, there are provided an upper heater 60 and a lower heater 70. The temperature of the upper heater 60 is set be higher than that of the lower 70. Thus, liquid-phase crystal growth is accomplished by virtue of the temperature difference produced.

Since Se serves as the solvent in this mixed melt metal of Zn and Se, and since this example relies on the temperature difference method, the liquid phase growth can be accomplished at a temperature lower than 1000° C.

Doping impurities such as gold, silver or phosphorus to be charged in the melt are listed in Table 2. It is desirable from the viewpoint of the pn junction characteristics to carry out the growth at a temperature ranging from 800° to 400° C., which is much lower than 950°–900° C. which are the temperatures for growing a substrate crystal. The concentrations of Se vacancies or its complexes with impurities are lowered because the temperature used in the present invention is very low. Thus, a diode which emits blue or green light can be obtained.

The above-described method of forming a pn junction can be applied equally effectively to ZnS, CdS and CdSe, other than ZnSe. Needless to say, it is necessary that the solvent which is a melt and which is used in the growth of a crystal be comprised of the element having a higher vapor pressure among the elements constituting the aimed Group II-VI compound semiconductor, and also that the same element as that mentioned above be used to supply its vapor pressure to the region wherein the device is present in the process containing a heating step, to minimize the deviation from stoichiometry and not to induce stresses or imperfections into the crystal being grown. In such Group II-VI compound semiconductors as ZnS, ZnSe, CdS and CdSe, it should be noted that Group VI elements have a higher vapor pressure except such crystals as ZnTe or CdTe which contain Te. CdS has a band gap of 2.5 eV. Thus, it is suitable as an LED emitting a green or yellow light, if the energy value of the acceptor level is subtracted from the value of the energy band gap.

Those acceptor impurities of Group II-VI compound semiconductors such as silver shown in Table 2 for ZnSe could form two or more acceptor levels. In such an instance, not only can there be a transition for emitting a blue color light, but also there concurrently can be the transition for emitting a red or yellow color light. Even in such a case, an emission of an almost pure blue light can be obtained by the inclusion, in the epoxy resin which covers the LED, of a substance such as $Fe_2O_3$ which absorbs light in the red and yellow band.

What is claimed is:

1. A method of manufacturing a semiconductor device having a single crystal pn junction formed in a Group II-VI compound semiconductor crystal, comprising:

growing a Group II-VI compound semiconductor crystal substrate having n type conductivity from a melt of a crystal-constituting Group VI element other than Te and a Group II element;

forming a temperature difference in said melt by establishing a higher temperature zone in the upper region of the melt and a lower temperature zone in the lower region of the melt while holding the temperatures of the two zones constant and while constantly applying a vapor pressure of said Group VI element onto said melt throughout the growth of the crystal; and forming, on said n type Group II-VI compound semiconductor crystal substrate, a semiconductor region of p type conductivity by diffusing an acceptor impurity into said n type Group II-VI compound semiconductor crystal under a predetermined vapor pressure of the crystal-constituting Group VI element.

2. A method according to claim 1, wherein:
said acceptor impurity is one having a diffusion coefficient greater than of vacancy produced in said crystal during doping of said impurity, by diffusion, into said crystal.

3. A method according to claim 1, wherein:
said n type Group II-VI compound semiconductor crystal substrate is ZnSe;
said melt is Se and serves as a solvent; and
said vapor of the crystal-constituting Group VI element is that of Se.

4. A method according to claim 3, wherein: the diffusion is conducted at a temperature lower than 600° C. under a vapor pressure of 0.1 Torr or more of Se, and said impurity is selected from gold and silver.

5. A method according to claim 1, wherein:
said n type Group II-VI compound semiconductor crystal substrate is ZnSe;
said melt is Se and serves as a solvent;
said vapor of the crystal-constituting element is that of Se; and
said acceptor impurity is gold.

6. A method according to claim 5, wherein: the diffusion of gold is conducted at a temperature ranging from 400° C. to 300° C.

7. A method according to claim 1, wherein:
said temperature difference in said melt is about 40° C., and the temperature of the vapor portion of said melt is about from 950° C. to 990° C.

8. A method of manufacturing a semiconductor device having a single crystal pn junction formed in a Group II-VI compound semiconductor crystal comprising:

growing a Group II-VI compound semiconductor crystal substrate having n-type conductivity from the melt of the crystal-constituting Group VI element except Te, forming a temperature difference in said melt by establishing a higher temperature zone in the upper region of the melt and a lower temperature zone in the lower region of the melt while holding the temperature of the two zones constant and while constantly applying a vapor pressure of said Group VI element onto said melt throughout the growth of the crystal;

forming, on said n-type Group II-VI compound semiconductor crystal substrate, a semiconductor region of p type conductivity by relying on liquid-phase epitaxial growth technique from the melt of the crystal-constituting Group VI element excepting Te; and forming a temperature difference in said melt while holding each portion of said melt at a constant temperature, and constantly applying a vapor pressure of said Group VI element onto said melt throughout the growth of the crystal.

9. A method according to claim 8, wherein:
said Group II-VI compound semiconductor crystal is ZnSe and said melt is Se serving as the solvent, and said vapor of the crystal-constituting Group VI element is that of Se.

10. A method according to claim 9, wherein:
said Group II-VI compound semiconductor crystal substrate is grown at a temperature of about 40° C., and the upper portion of said melt is held at a temperature difference of about from 950° C. to 990° C.

* * * * *